United States Patent
Bordiga

(10) Patent No.: US 7,502,229 B2
(45) Date of Patent: Mar. 10, 2009

(54) HEAT DISSIPATION SYSTEM FOR MULTIPLE INTEGRATED CIRCUITS MOUNTED ON A PRINTED CIRCUIT BOARD

(75) Inventor: Peter Carl Bordiga, Petaluma, CA (US)

(73) Assignee: Alcatel Lucent, Paris (FR)

( * ) Notice: Subject to any disclaimer, the term of this patent is extended or adjusted under 35 U.S.C. 154(b) by 509 days.

(21) Appl. No.: 11/157,667

(22) Filed: Jun. 21, 2005

(65) Prior Publication Data
US 2006/0082974 A1    Apr. 20, 2006

Related U.S. Application Data

(60) Provisional application No. 60/619,515, filed on Oct. 15, 2004.

(51) Int. Cl.
*H05K 7/20*    (2006.01)
*H01L 23/48*    (2006.01)

(52) U.S. Cl. .......... 361/719; 361/704; 361/718; 361/720; 257/718; 257/723; 174/15.1; 174/16.1; 174/16.3; 174/252; 165/80.3; 165/104.33; 165/185

(58) Field of Classification Search .......... 361/690–697, 361/699, 704, 707–711, 715, 719, 720–727, 361/732, 761; 165/80.2, 80.3, 185, 104.33; 174/15.1, 16.1, 16.3; 257/706, 707, 712, 257/713, 718, 719, 727, 733
See application file for complete search history.

(56) References Cited

U.S. PATENT DOCUMENTS

| | | | | |
|---|---|---|---|---|
| 5,262,922 A | * | 11/1993 | Yamaji et al. | 361/720 |
| 5,270,902 A | * | 12/1993 | Bellar et al. | 361/718 |
| 6,181,561 B1 | * | 1/2001 | Albrecht et al. | 361/719 |
| 6,504,722 B2 | * | 1/2003 | Vittet et al. | 361/704 |
| 6,515,864 B2 | * | 2/2003 | Wakabayashi et al. | 361/719 |
| 6,534,860 B2 | * | 3/2003 | Turner | 257/718 |
| 6,680,532 B1 | * | 1/2004 | Miller et al. | 257/723 |
| 6,868,217 B1 | * | 3/2005 | Moulton et al. | 385/135 |

FOREIGN PATENT DOCUMENTS

| | | |
|---|---|---|
| EP | 0888039 A2 | 12/1998 |
| FR | 2679929 A1 | 2/1993 |
| JP | 02004031627 A * | 1/2004 |
| WO | 00/41448 A1 | 7/2000 |

* cited by examiner

*Primary Examiner*—Michael V Datskovskiy

(57) ABSTRACT

A system is provided for heat sinking and environmental dissipation of heat generated by one or more ICs mounted to a printed circuit board. The system includes a primary thermally conductive plate and one or more thermally conductive discs attached to the primary plate. The one or more thermally conductive discs make intimate contact with the one or more ICs mounted to the printed circuit board such that the heat generated by the one or more ICs in operation transfers through the one or more discs and onto the plate, whereupon the heat laterally distributes across the primary plate and dissipates into the environment.

15 Claims, 7 Drawing Sheets

HEAT DISSIPATION SYSTEM FOR MULTIPLE INTEGRATED CIRCUITS MOUNTED ON A PRINTED CIRCUIT BOARD

CROSS-REFERENCE TO RELATED APPLICATIONS

The present invention claims priority to a provisional patent application 60/619,515 filed on Oct. 15, 2004, entitled "Printed Circuit Board Heat Spreader". The entire disclosure of said provisional patent application is included herein at least by reference.

BACKGROUND OF THE INVENTION

1. Field of the Invention

The present invention is in the field of electronics thermal management, pertaining particularly to the management of printed circuit boards (PCBs) used in the telecom and other industries where such boards are mounted in close proximity to each other in a rack or housing, e.g., telecommunications system channel bank. The present invention pertains to methods and apparatus for creating and maintaining acceptable operating temperatures on said boards through use of a specialized heat sink attached to the board's integrated circuits (ICs).

2. Discussion of the State of the Art

In the field of electronics, PCBs are used to support mounted electronics components, including integrated circuits for use in powering and providing function to electronic devices and systems. In the field of telecommunications, a plurality of PCBs are often arranged as a group in parallel relationship to each other and in close proximity to each other, especially in telecommunications equipment like telecommunications channel banks.

In typical individual PCB structures, there are a variety of techniques and apparatus employed for the purpose of helping maintain acceptable temperatures for heat-generating ICs mounted to the board. Of these known types, individual passive heat sinks and thermally conductive board layers are the most common. These, however, have become increasingly less effective with the advent of higher speed ICs required on the PCBs of telecommunications and other industries. These faster ICs generate more heat, and, when enough are mounted together on a PCB, can generate enough heat to render individual passive sinks or conductive layers inadequate. The problem is exasperated further when multiple boards are operating in close proximity to one another.

More thermally effective types of heat dissipation systems are available in the art such as micro-fans, thermoelectric heat sinks, or heat-pipe assisted sinks. While thermally effective, there is a higher cost for implementing these types and there are more reliability problems with the use of these systems. Moreover, the housing arrangement typically required of a plurality of PCBs arranged in parallel and in close proximity to each other, such as in a telecommunications channel bank, for example, makes implementation of space-consuming control contrivances very difficult if not impossible. This is because systems like telecommunications channel banks have very limited space available between installed cards (PCBs) and may have no permissible space outside of channel banks to provide mounting space for heat rejection surfaces that may be used in heat pipe systems or the like.

Therefore, what is clearly needed in the art is a thermal heat sink and dissipation system for temperature control and maintenance of multiple ICs mounted to a PCB that may be implemented with other like PCBs in tight, minimally-spaced board configurations and that may be provided of low-cost materials and labor.

SUMMARY OF THE INVENTION

A system is provided for heat sinking and environmental dissipation of heat generated by one or more ICs mounted to a printed circuit board. The system includes a primary thermally conductive plate, and one or more thermally conductive discs attached to the primary plate. In a preferred embodiment, the one or more thermally conductive discs make intimate contact with the one or more ICs mounted to the printed circuit board such that the heat generated by the one or more ICs in operation transfers through the one or more discs and onto the plate, whereupon the heat laterally distributes across the primary plate and dissipates into the environment.

In one embodiment, the printed circuit board is a line card and the plate is one of aluminum or copper. In this embodiment, the one or more discs are also composed of aluminum or copper. Also in one embodiment, the one or more discs are attached to the plate using pop rivets.

In one embodiment, intimate contact between the one or more discs and the one or more ICs is a measured gap filled with a thermal dielectric compound. In another embodiment, the intimate contact between the one or more discs and the one or more ICs is a flush surface-to-surface interface. In a preferred embodiment, the primary plate is separated from the PCB in a parallel plane by a plurality of standoffs.

In another embodiment, the system further includes a secondary thermally conductive plate mounted to the primary plate; and one or more thermally conductive discs attached to the secondary plate, wherein the discs attached to the secondary plate make intimate contact with one or more ICs mounted to the printed circuit board not contacted by any discs attached to the primary plate. (Contact access to the ICs is provided through openings in the primary plate.) In this embodiment, the secondary plate is one of copper or aluminum. Also in this embodiment, the secondary plate is separated in a parallel plane from the primary plate by a plurality of standoffs. The one or more discs attached to the secondary plate are composed of copper or aluminum.

In one embodiment, intimate contact between the one or more discs attached to the secondary plate and the one or more ICs, is a measured gap filled with a thermal dielectric compound. In another embodiment, the intimate contact between the one or more discs attached to the secondary plate and the one or more ICs is a flush surface-to-surface interface.

In a variation to the above embodiments, the one or more ICs are mounted to both sides of the PCB and wherein the secondary plate is mounted to the PCB on the side opposite of the primary plate.

According to another embodiment of the present invention, a system for heat sinking and environmental dissipation of heat generated by a plurality of ICs distributed among and mounted to a plurality of printed circuit boards is provided. The system includes a plurality of thermally conductive plates mounted at least one each to the printed circuit boards; a plurality of thermally conductive discs, one or more attached to each of the plurality of plates; and a cooling source for directing cold air to the plurality of plates.

In a preferred embodiment, the discs make intimate contact with said ICs, transferring heat generated therefrom onto the plates, where it is distributed laterally and removed to the environment by airflow directed on the plates from a cooling source. In this embodiment, the plates and the discs are composed of copper or aluminum.

In one embodiment, the plurality of printed circuit boards are line cards plugged into card slots arranged adjacently in a telecommunications channel bank. Also in one embodiment, the cooling source is a compressor for compressing and directing cold air into each of the card slots. In this embodiment, the plates are separated from the PCBs in parallel planes by a plurality of standoffs.

According to yet another aspect of the present invention, a method is provided for mounting a thermal heat-sink system to a line card, the system including a thermally conductive plate, and one or more thermally conductive discs attached to the plate. The method includes steps for (a) inserting at least 2 alignment set screws into threaded standoffs provided on the line card; (b) positioning the system, discs facing the line card, over the alignment set screws and setting the system down on the standoffs, with the alignment set screws extending through pattern matched openings in the system plate; (c) threading machine screws into the standoffs not containing an alignment screw, the machine screws inserted through pattern matched openings in the plate of the system; (d) tightening the machine screws to an acceptable torque; (e) removing the alignment set screws; (f) threading machine screws into the remaining standoffs through the remaining pattern matched openings in the plate of the system; and (g) tightening the machine screws to the acceptable torque.

In one aspect, the method further includes a step between steps (a) and (b) for applying a thermal dielectric compound to each of the thermally conductive discs for bridging gaps between disc faces and ICs.

BRIEF DESCRIPTION OF THE DRAWING FIGURES

DETAILED DESCRIPTION

The inventor provides a heat sink and dissipation system for PCBs that is adapted to thermally control a plurality of ICs mounted on said PCBs in an efficient, load-sharing manner. The methods and apparatus of the invention are described in enabling detail below.

Figure 1:
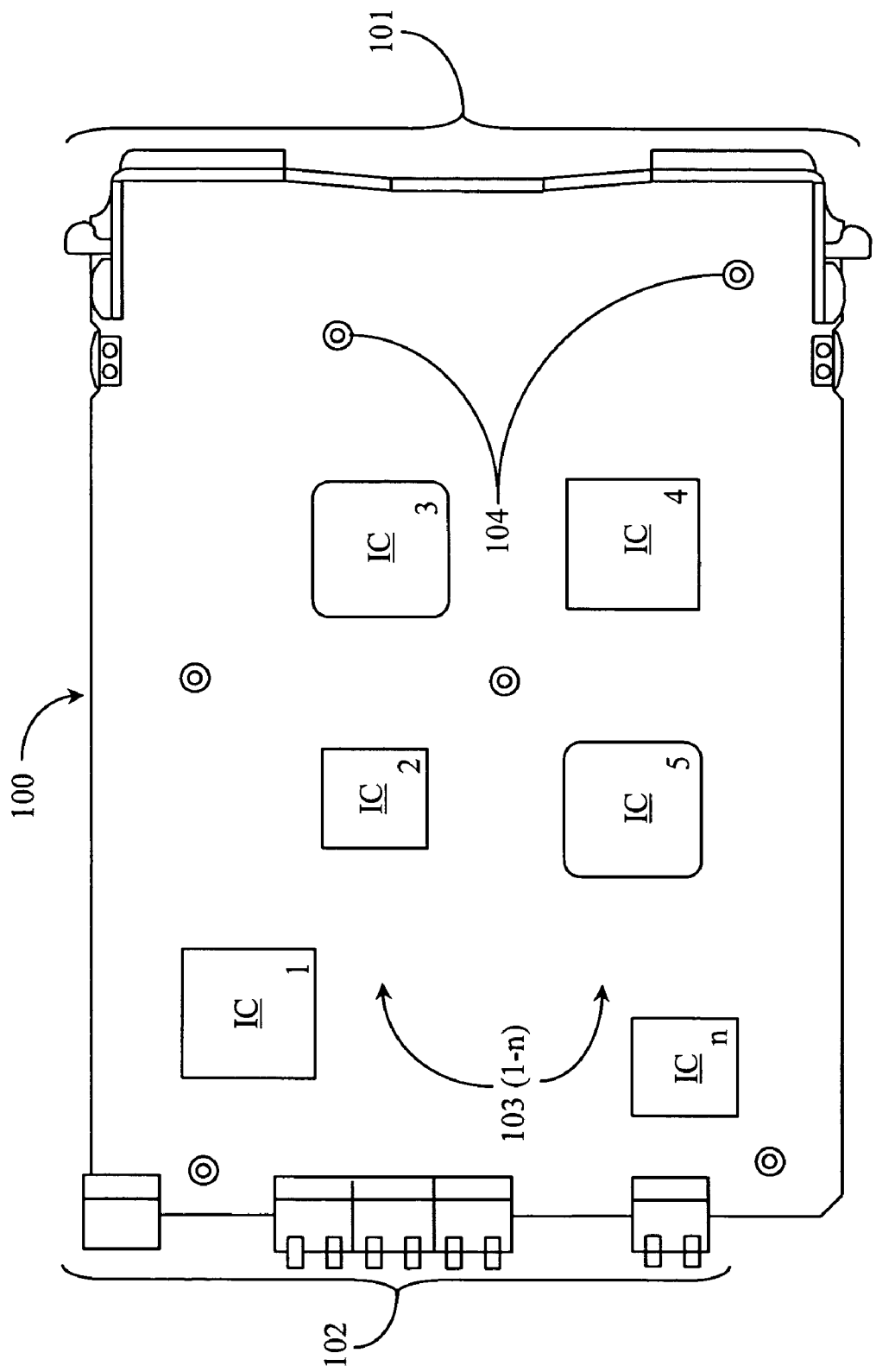
FIG. 1 is a plan view of a telecommunications PCB containing mounted ICs.

FIG. 1 is a plan view of a telecommunications PCB 100 containing mounted ICs. PCB 100 may be assembled in the form of a telecommunications line card, such as one that may be used in close proximity with other like PCBs in a telecommunications channel bank for example. This specific implementation is not required in order to practice the present invention however it serves to better explain the methods and apparatus of the invention, which are particularly beneficial for the type of implementation described.

PCB 100 is adapted to be plugged into a bay or card slot by virtue of electronics plug assemblies 102, which provide power and communications connectivity for the unit. In this embodiment, PCB 100 may be a Telco-side interface circuitry to a local wired telephony loop. PCB 100 has card positioning and securing apparatus 101 mounted thereon and adapted to enable PCB 100 to be secured in vertical position in a PCB slot adapted to accept the PCB. One with skill in the art of telecommunications channel banks, routers, and other scalable architectures will appreciate that PCB 100 may be housed in close proximity with many other like PCBs in vertical or horizontal rack array configuration.

PCB 100 has a plurality of ICs 103 (1-n) mounted thereon and adapted to provide various functions of, in this case, telecommunications operations and tasks. It is noted herein that ICs 103 (1-n) are arranged in no particular symmetric array, but are mounted on PCB 100 at their predestined locations per design. It may be assumed that other like PCBs sharing a rack with PCB 100 may have identical ICs mounted in identical positions on those PCBs. It may also be assumed that there may be other PCBs grouped with PCB 100 that may be of a different configuration in terms of number type and mounted locations of ICs.

ICs 103 (1-n) may generate an appreciable amount of heat during operation and together, may generate enough heat that a safe operating temperature maximum may be reached and surpassed. In addition to PCB 100, other PCBs in an array also generate appreciable heat. Collectively, the heat generated by many such PCBs may cause failure of one or more PCBs in an array. Because of tight quarters typical of a telecommunication channel bank, for example, prior art heat sink apparatus and powered mechanisms may be difficult to implement properly and may be costly as was described above in the background section of this specification.

In this example, PCB 100 has a plurality of standoffs 104 provided thereto and strategically located thereon. Standoffs 104 are annular in shape and of such a height so they may connect a heat sink and dissipation plate assembly to PCB 100 in a plane substantially parallel to PCB 100. Standoffs 104 may be manufactured of high temp polymers, metals, or other durable materials and do not have to be manufactured of any thermally conductive materials, although this may be preferred. Standoffs 104 are tubular and are open in the center and threaded on the inside diameter to accept a threaded machine screw at both ends.

Standoffs 104 may be pre-positioned over openings provided through PCB 100 and adapted for the purpose of locating the standoffs in proper position and for inserting machine screws and lock nuts through the back side of PCB 100 and into standoffs 104 securing them for mounting. Standoffs 104 may also be adhered to PCB 100 in position and may be placed in location of adhesion thereon by method of pin alignment or other known methods. In one embodiment, standoffs 104 are positioned in annular recesses provided on the interfacing surface of PCB 100 and adapted to hold standoffs 104 in tight-fitting position. In either case, machine screws may be used to secure standoffs 104 to PCB 100 and eventually to secure the heat sink and dissipation assembly over the standoffs.

Figures 2A, 2B:
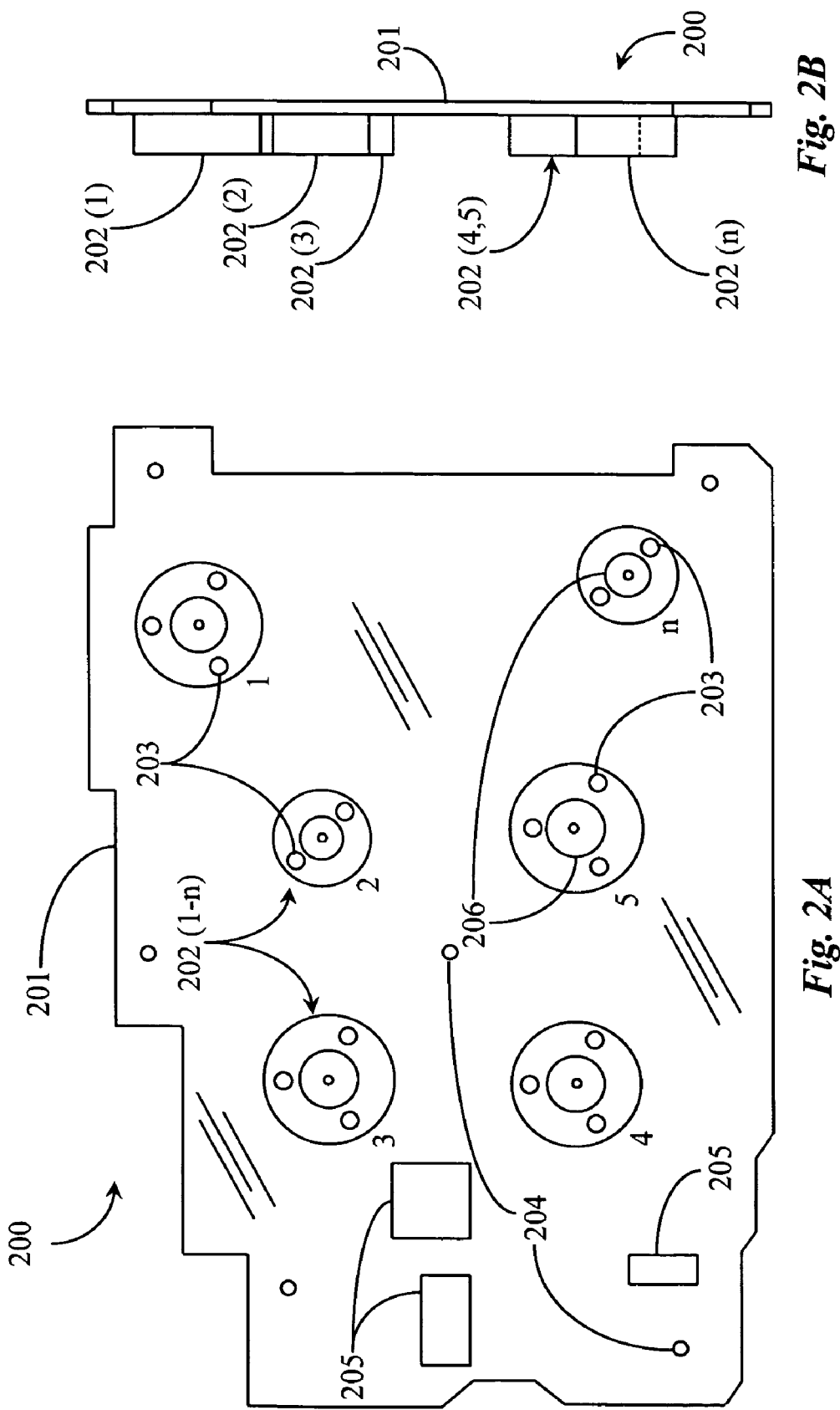
FIG. 2A is a plan view of a heat sink and dissipation assembly according to an embodiment of the present invention.
FIG. 2B is a right side view of the heat sink and dissipation assembly of FIG. 2A.

FIG. 2A is a plan view of a heat sink and dissipation assembly 200 according to an embodiment of the present invention. Heat sink and dissipation assembly 200, which may be referred to hereafter as simply plate assembly 200 or assembly 200, is adapted to be mounted onto PCB 100 described above over standoffs 104 in a position parallel to PCB 100. Plate assembly 200 includes a manufactured plate 201 and a plurality of machined discs 202 (1-n) provided thereto and mounted thereon one side in a strategic array matching the pattern of the IC array described with respect to FIG. 1 above.

Plate 201 is manufactured of a heat conductive metal such as aluminum or copper. Plate 201 is optimally held to a thickness in manufacture of approximately $1/16^{th}$ of an inch or (0.064"). However, it may be slightly thicker or thinner depending on exact design preferences. Plate 201 is substantially flat across both major surfaces and is machined on portions thereof to acquire a desired peripheral geometry including peripheral cutouts, chamfers, and steps as may be required to provide relief space for any components or features of the PCB that otherwise might make undesirable contact with the edges of plate 201 in a mounted position. Likewise, plate 201 may have a plurality of interior openings illustrated herein as openings 205 placed there through. Openings 205 are generally geometric in design and may be adapted to provide relief for any particular PCB components that may otherwise make undesirable contact with the surface of plate 201 in mounted position. The exact geometric profile of plate 201 including presence of and geometric profile of any cutout openings provided there through is determined by geometric requirements of the PCB to which it will be mounted.

Conductive discs 202 (1-n) may be manufactured from a high heat conductive material such as aluminum or copper. It is noted herein that discs 202 (1-n) are not all of the same diameter. The outside diameter of each conduction disc 202 (1-n) is determined, in part, by the size of the individual IC, which will come into close contact with a disc when plate assembly 200 is mounted. The pattern of location of discs 202 (1-n) is the same pattern of location related to ICs 103 (1-n) with respect to PCB 100 described further above. In this view, the visible side of assembly 201 is the side facing a PCB when mounted.

Discs 202 (1-n) are, in a preferred embodiment, solid discs manufactured to hold a height measurement that is substantially uniform across the face of the disc. That is to say that both major surfaces or faces of a disc (202 (1-n) are held substantially parallel to each other through machining practice. The height dimension held in manufacture may vary from disc to disc and is determined in part by the height dimensions of ICs mounted to a PCB as taken from the mounting surface. In one embodiment when plate assembly 200 is mounted to a PCB, each facing surface of each disc 202 (1-n) makes a substantially flush and intimate contact with respective facing surfaces of ICs located on the PCB in the same location pattern (mirror imaged) as the discs. In another embodiment, a pre-determined space or gap is maintained between disc and IC contact surfaces. In both cases, a low resistive thermal conducting compound may be used to ensure heat transfer between the heat-dissipating ICs and discs 202 (1-n).

Discs 202 (1-n) have openings 203 placed thereon in geometric mounting patterns. Openings 203 are adapted to accept standard pop rivet components and align with like openings placed through plate 201 and adapted for the purpose. For larger discs, there are 3 openings 203 arranged in a triangular mounting pattern, the openings equally spaced from one another. For smaller discs, there are 2 openings 203. For even smaller discs, 1 opening 203 may be provided substantially in the center of the disc. In a preferred embodiment, discs 202 (1-n) are affixed to plate 201 using pop rivets, but one with skill in the art will recognize that other standard methods for affixing metallic components together may also be used without departing from the spirit and scope of the present invention. A thin film of appropriate thermal compound may be applied at the disc 202/plate 201 interface to assure optimal thermal conduction across said interface.

Discs 202 (1-n) each have a scribed circle 206 provided on the face that interfaces with an IC. Scribe circles 206 are provided substantially centered on each disc with a scribing tool or other instrument capable of leaving a circular scribe mark. It is noted that each disc 202 (1-n) also as a center-mark or divot placed thereon by machine practice. The divot provides a base from which to create a scribe circle 206. The purpose of scribe circle 206 is to define an area in the center of each disc 202 (1-n) for application of a curable thermal compound (not illustrated). The thermal compound is applied just before mounting assembly 200 to a PCB and is allowed to cure while mounted. The purpose of the compound is to insure optimum heat transfer from the ICs mounted on the PCB, through discs 202 (1-n) and into plate 201. As heat is transferred to plate 201 it naturally spreads across the plate and then dissipates into the environment. Assembly 200 is termed by the inventor, a "heat spreader" assembly owing to this featured capability.

FIG. 2B is a right side view of the heat sink and dissipation assembly 200 of FIG. 2A. In this view, discs 202 (1-n) are viewed in side profile. Features such as through openings, cut outs and the like which are otherwise not directly visible in this view are not illustrated.

Figure 3:
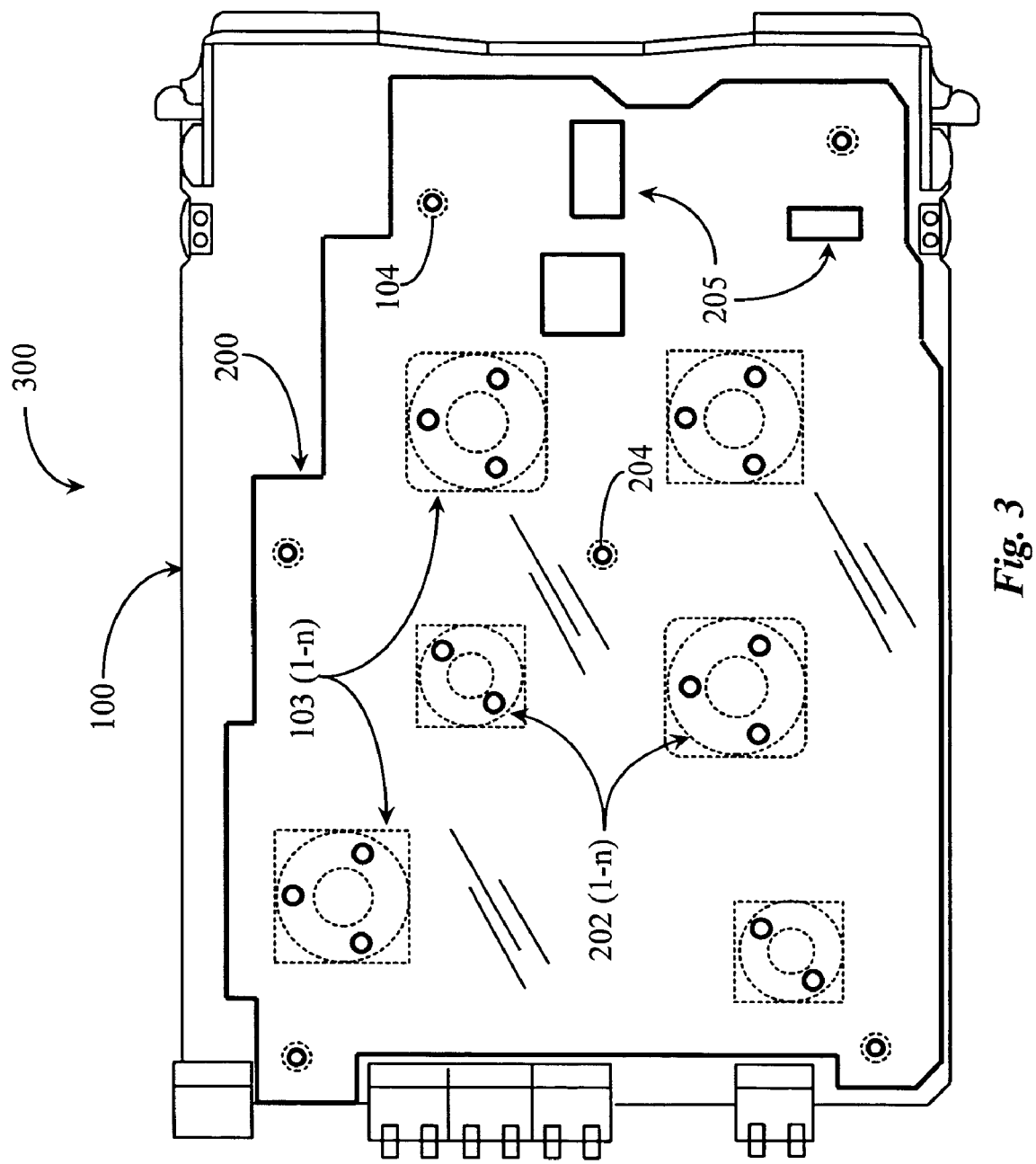
FIG. 3 is a plan view of the PCB of FIG. 1 with the heat sink and dissipation assembly of FIG. 2A installed according to an embodiment of the present invention.

FIG. 3 is a plan view of PCB 100 of FIG. 1 with heat sink and dissipation assembly 200 of FIG. 2A installed according to an embodiment of the present invention. A thermally protected PCB assembly 300 is achieved by mounting heat spreader assembly 200 onto PCB 100 as is illustrated in this view. Discs 202 (1-n) on the far side of plate 201 make contact with ICs 103 (1-n) as previously discussed. Standoffs 104 provide the spacing in part with individual height dimensions of discs 202 (1-n) to insure proper contact between discs and ICs and to permit optimal flow of cooling air between plate 201 and PCB 100. The circular shape of discs 202 (1-n) and standoffs 104 further helps to optimize said flow. One thermal cooling system may be employed for an entire rack or bank of assemblies 300. In one embodiment, several banks may be serviced by one thermal cooling system.

In practice of the present invention, the heat spreader assembly works by transferring heat from ICs 103 (1-n) through discs 202 (1-n) to the spreader plate, where it is distributed evenly across the plate for subsequent removal to the environment. Unlike a conventional passive heat sink for an individual IC, spreader assembly 200 shares the collective heat load of all contacted ICs, enabling a more effective transfer of heat by virtue of a greater heat sink surface area. Empirical testing indicates a much greater heat transfer capability than can be achieved using individual sinks or proactive apparatus under the same given conditions.

As described above, component 300 may be installed vertically or horizontally in a card slot of a telecommunication channel bank with numerous other PCBs also employing heat spreader assemblies like assembly 200. (In a preferred embodiment, said channel bank is placed in series with an appropriate air delivery system to force cooling air through the bank's card slots.) Because of their high conductivity characteristics and relative position between the PCBs in the bank, the spreader plates are maintained at nearly isothermal conditions while being bathed in the coolest possible air flowing through the slots. Under these conditions the highest average temperature difference between the plates and air over the largest surface area is produced, thereby affecting a greater amount of heat transfer than can be achieved using individual IC heat sinks.

Figure 4:
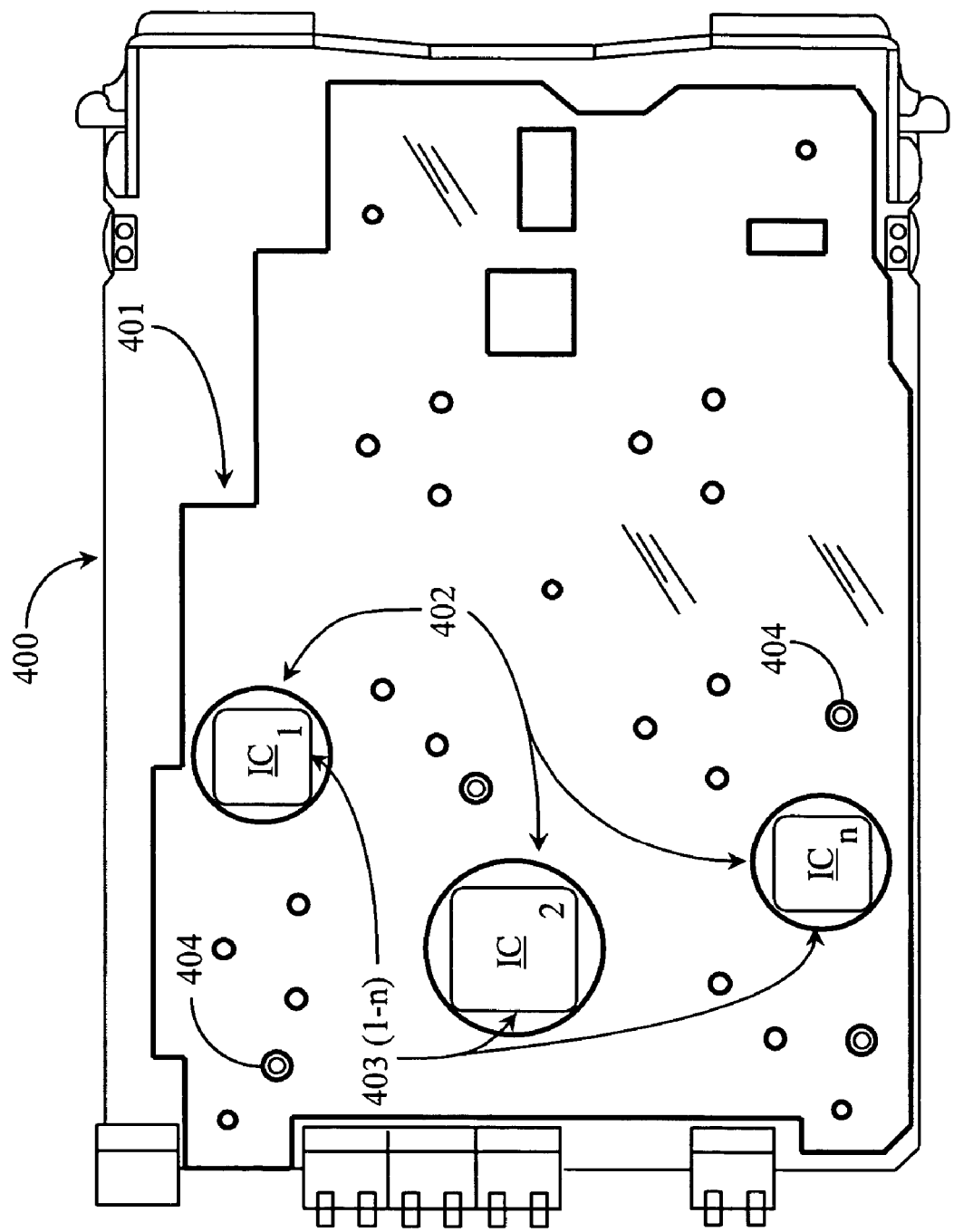
FIG. 4 is a plan view of a PCB with a heat sink and dissipation assembly installed and adapted to accept a second heat sink and dissipation assembly according to another embodiment of the present invention.

In one embodiment, more than one heat spreader assembly may be mounted to a single PCB. FIG. 4 is a plan view of a PCB 400 with a heat sink and dissipation assembly 401 installed and adapted to accept a second heat sink and dissipation assembly according to another embodiment of the present invention. PCB 400 is somewhat analogous to PCB 100 described above with respect to FIG. 1 with the exception that some of the ICs mounted to it are not contacted by a first heat spreader analogous to spreader assembly 200 described above. In this example, a spreader assembly 401 is provided to transfer heat from 6 ICs (not illustrated) as described above. However, PCB 400 has 3 additional ICs 403 (1-n) mounted to it. Heat spreader assembly 401 has internal circular cut outs 402 placed thereon in a location pattern mirroring that of ICs 403 (1-n).

Openings 402 are provided of such a diameter as to enable access to ICs 403 (1-n) by contact discs of a second heat spreader assembly adapted to transfer heat from just those ICs visible in this view. In this case, a plurality of standoffs 404 are provided and strategically affixed to the back (visible) surface of assembly 401 in similar fashion as described above with respect to PCB standoffs 104 of FIG. 1. In one embodiment, standoffs 404 are provided from a heat resistive material due to a fact that they are located between two highly conductive plates.

Figure 5B:
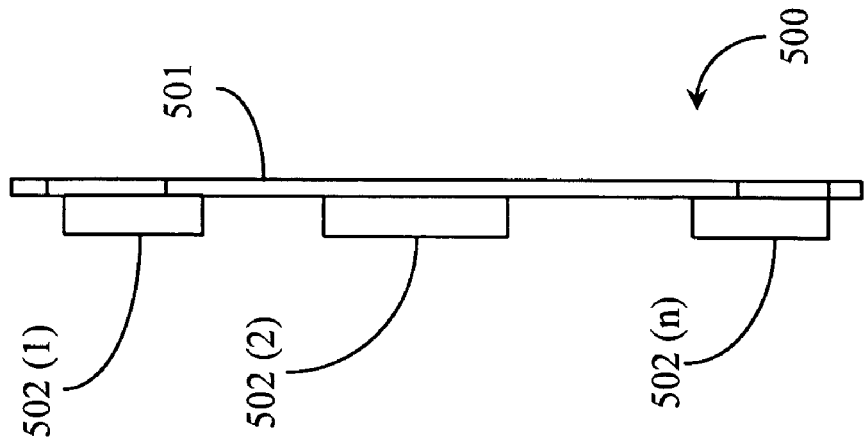
FIG. 5B is a right side view of the heat sink and dissipation assembly of FIG. 5A.
Figure 5A:
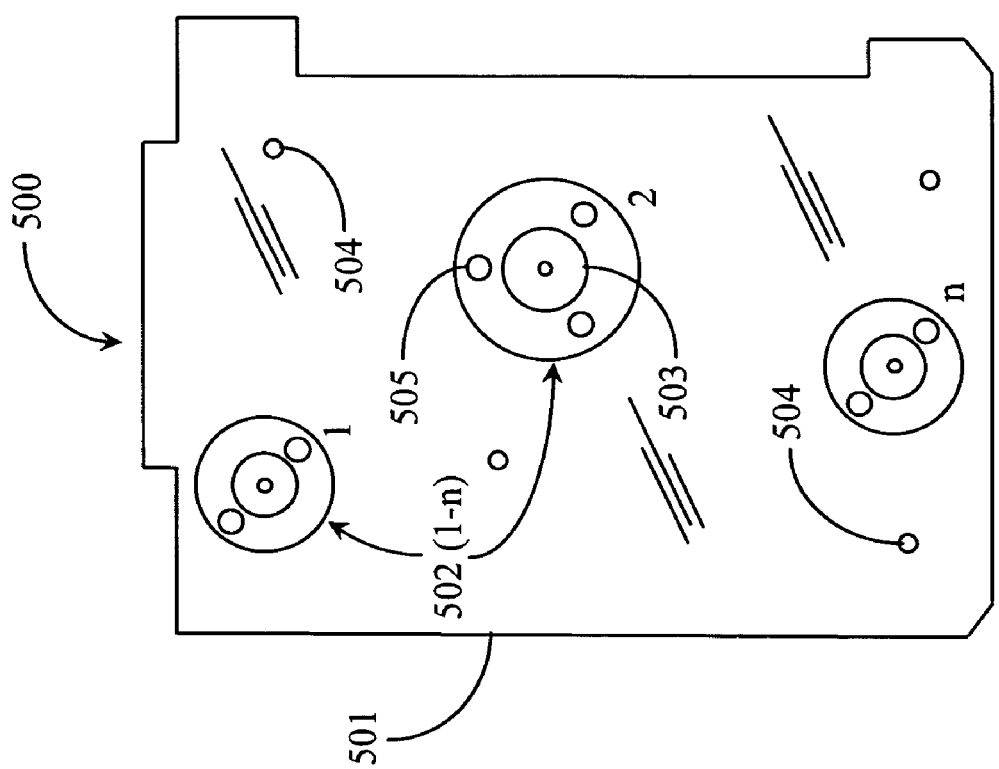
FIG. 5A is a plan view of a second tier heat sink and dissipation assembly according to an embodiment of the present invention.

FIG. 5A is a plan view of a second tier heat sink and dissipation assembly 500 according to an embodiment of the present invention. Heat spreader assembly 500 is adapted as a second tier assembly for heat sinking ICs 403 (1-n) mounted on PCB 400 described above. Assembly 500 includes a highly conductive plate 501 and a plurality of contact discs 502. Plate 501 is analogous in description to plate 201 described above with reference to FIG. 2. Likewise, discs 502 (1-n) are analogous to discs 202 (1-n) of the same FIG. 2 in both description and preferred method of attachment to plate 501. That is to say that spreader assembly 500 is analogous to assembly 200 described further above accept for overall peripheral dimensioning. Standoff openings 504 are provided through plate 501 in a location pattern matching the location pattern of standoffs 404.

FIG. 5B is a right side view of heat sink and dissipation assembly 500 of FIG. 5A. In this view, contact discs 502 (1), 502 (2), and 502 (n) are clearly visible in right-side profile. When mounted over heat spreader assembly 400 of FIG. 4, contact discs 502 (1-n) will make contact with ICs 403 (1-n) through relief openings 402. Application of assembly 500 onto assembly 401 is the same as the application of assembly 200 to PCB 100 described further above except that assembly 500 mounts to assembly 401 rather than to a PCB.

Figure 6:
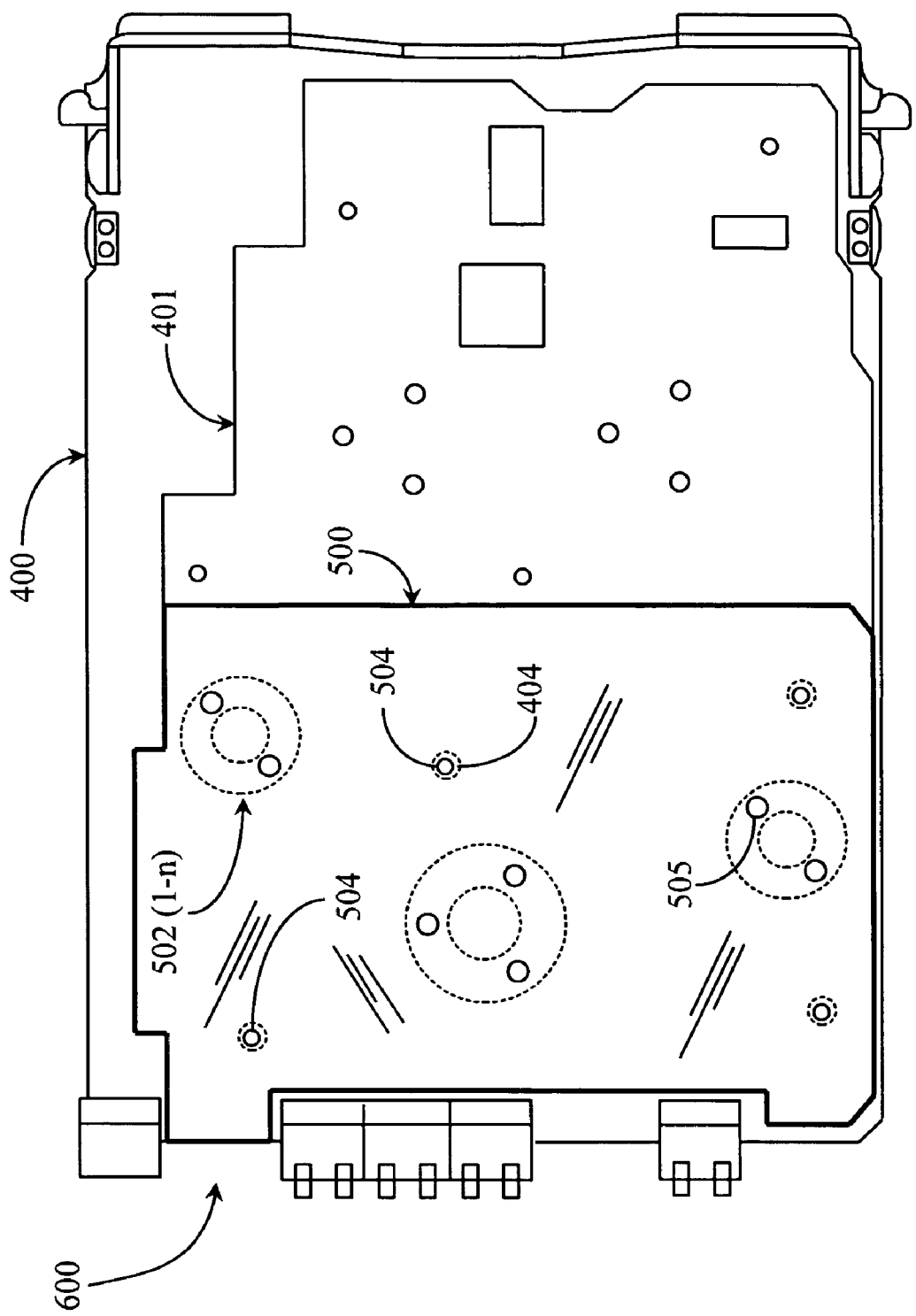
FIG. 6 is a plan view of a PCB assembly with a two tiered heat sink and dissipation capability according to an embodiment of the present invention.

FIG. 6 is a plan view of a PCB assembly 600 with a two-tier heat sink and dissipation capability according to an embodiment of the present invention. Component 600 has heat spreader assembly 401 mounted thereto and a second tier of heat sink capability is added by virtue of heat spreader assembly 500 mounted to assembly 401. Contact discs 502 (1-n) are illustrated (far side) making contact with the previously exposed ICs 403 (1-n) described with reference to FIG. 4.

Such two-tier implementations are possible and practical provided that the width of a card slot is sufficient to accommodate the overall width of the double-sink plate assembly. In this embodiment, heat spreader assembly 500 collects and dissipates the heat generated by the ICs that are not handled by spreader assembly 401, namely ICs 403 (1-n). This embodiment offers a method of removing heat from a cluster of ICs of high power density, where a single tier spreader would not offer enough surface area or temperature difference with the environment to provide adequate heat transfer.

In an alternate embodiment of the present invention, heat spreader assemblies may be implemented on both sides of a PCB. This case assumes that there are ICs mounted to both sides of a particular PCB. In still another embodiment one heat spreader assembly may be implemented between two separate PCBs. In this embodiment there are appropriate contact discs installed on both sides of the spreader plate, those discs making contact to the appropriate ICs of both PCBs.

Figure 7:
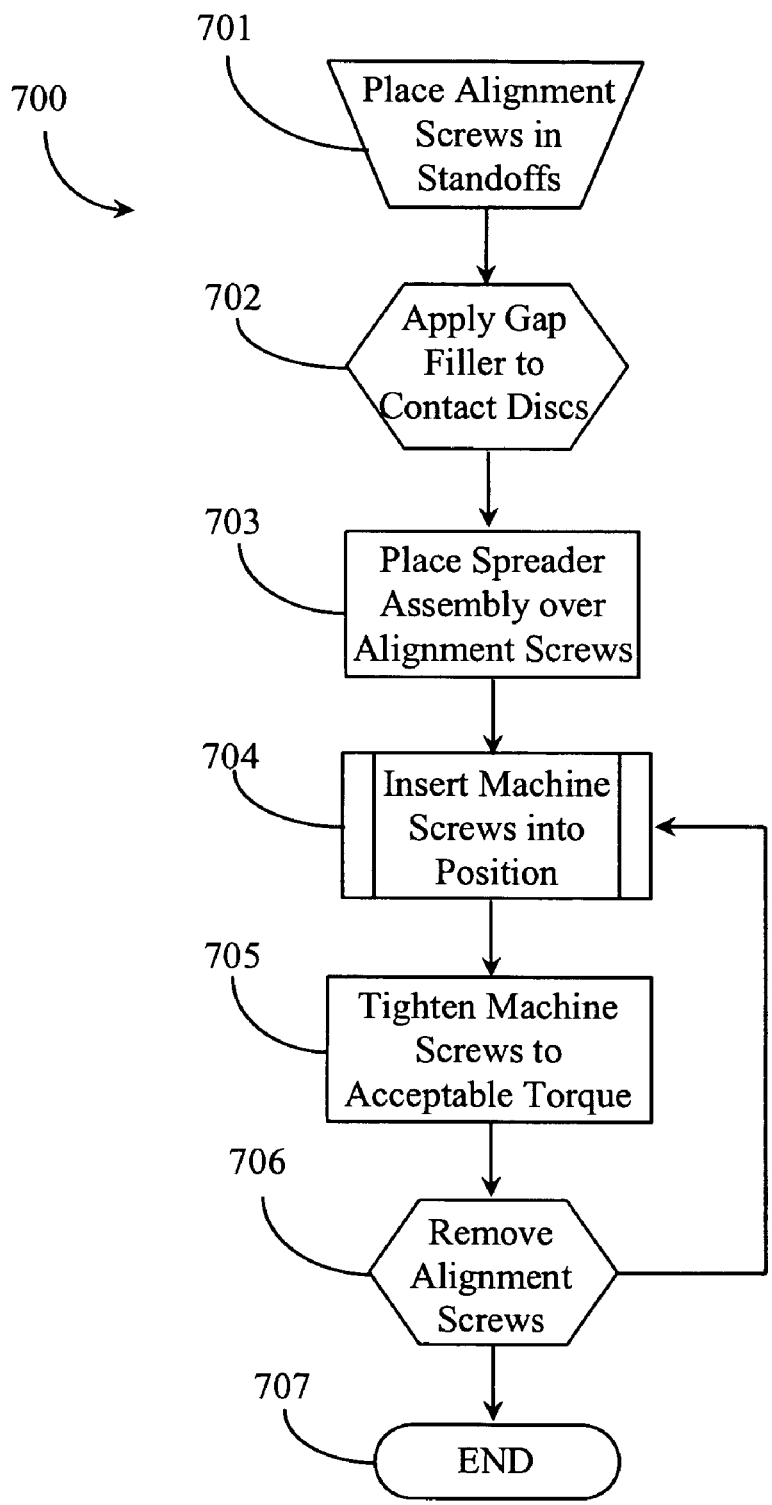
FIG. 7 is a process flow chart illustrating steps for mounting a heat sink and dissipation assembly to a PCB according to an embodiment of the present invention.

FIG. 7 is a process flow chart illustrating steps for mounting a heat sink and dissipation assembly to a PCB according to an embodiment of the present invention. At step 701, alignment screws (4-40) or other suitable threading are placed into appropriate standoffs. It is preferred that 2 alignment set screws are inserted into standoffs, which are located some distance apart from each other, say in opposite corners for example.

At step 702, thermal gap filler is applied to all of the contact discs on the heat spreader assembly beginning with a first disc and ensuing until all contact discs are treated. Step 702 assumes some measured gap will exist between ICs on the PCB and the contact disc faces when mounted. The gap filler is highly conductive and ensures heat transfer between the gaps. In an embodiment where contact discs will be mounted flush against ICs, thermal grease may be used instead of gap filler.

Application of the gap-filling compound may be accomplished using a mechanical applicator. The compound itself is a self-curing thermal dielectric compound available to the inventor. It is assumed in this process description that all of the contact disc surfaces have been inspected and cleaned if required to remove any particulate matter. It is also assumed that the compound has the appropriate thermal and fluid properties to facilitate heat spreader installation and performance.

In application of the gap-filling compound, it is recommended that the nozzle of the applicator be held in a vertical position about $\frac{1}{8}^{th}$ of an inch above the center mark of the contact disc when discharging the filler. The circular scribe on each disc marks a boundary to contain the filler. That is to say that the circle should be filled such that there is no overflow outside of the circle. The circular scribe is of a diameter determined by test or calculation to be that appropriate for meting out the correct amount of gap filler.

At step 703, the heat spreader assembly is positioned over the PCB such that in alignment over the setscrews, the contact discs align with the appropriate ICs on the PCB. In this step, the heat spreader assembly is placed down upon the standoffs over the alignment screws.

At step 704, machine screws with lock washers are placed through the openings in the spreader plate and threaded into the standoff openings that do not contain alignment screws. At step 705, the machine screws are tightened to an acceptable torque range.

At step 706, the alignment set screws are removed from their positions. The process resolves back to step 704 for the remaining standoff positions and then to step 705 for tightening the remaining screws thereby finishing the installation.

The process terminates at step 706 and the installation must cure (gap filler) for one to two hours before card-slot installation.

It is noted herein that the same basic process is observed when installing a second heat spreader assembly over one that is mounted to a PCB in a double tier implementation.

One with skill in the art will appreciate that in an embodiment of a two-tiered component, an inner space (between the first and second heat spreader) is created and may be narrower than the initial space created between the first plate and the PCB. This is because the contact discs of the second assembly recess through openings in the plate of the first assembly to make contact with the appropriate ICs. Therefore, the standoffs used to standoff the second plate may be shorter than those used to standoff the first plate from the PCB. Alternatively, the same length standoffs may be used if the disc heights of the contact discs on the second plate are proportionally greater to take up the offset. In the latter case, the inner spaces created between the PCB and the first plate and between the first and second plates may be relatively equal in gap distance.

It is noted herein that heat spreader assemblies may be removed from a PCB in the event that board needs to be serviced or reworked. In this case direct heat may be required in applications where gap filler was used and is in a state of cure. First, all of the machine screws holding the installation and other hardware should be removed from the heat spreader. Next, the user should select a contact disc location nearest an edge, preferably, a corner edge. Identifying the pop rivet pattern enables contact disc location. Next, the user should apply heat from a standard heat gun to the plate to warm up and soften the gap filler while at the same time applying separation pressure to pull the disc away from the IC it is in contact with. The same procedure applies to the remaining disc locations until the heat spreader assembly can be completely removed from the PCB. The application of heat to facilitate removal of the spreader only applies to those thermal gap fillers which soften when heated. To further facilitate removal, an appropriate mold release agent may be applied to the affected ICs and spreader discs prior to the initial assembly of the spreader to the PCB.

After the PCB and the heat spreader are cleaned from excess gap filler and the PCB is serviced, the spreader assembly can be remounted using the process of FIG. 7. One with skill in the art of assembly techniques will appreciate that the exact order of the steps as illustrated in the process of FIG. 7 may be different for different implementations. For example, on applications where flush contact is mandated between IC and contact disc, gap filler may not be used. Also in double tiered applications and applications of 2 PCBs and one spreader, or one spreader on either side of a PCB, the step order and content may be modified to reflect those particular installation embodiments without departing from the spirit and scope of the present invention.

The methods and apparatus of the present invention may be practiced with virtually any implementation of a PCB such as within a computer device, a communications device, or as described herein within a telecommunications channel bank or other card-slot architectures. Miniaturization may be practiced in cases where a component uses very small PCBs. Likewise, up scaling in dimensioning may be practiced for very large components used in industrial settings. There are many possibilities. The methods and apparatus of the present invention should be afforded the broadest consideration under examination in light of the various embodiments described and those envisioned. The spirit and scope of the present invention should be limited only by the claims that follow.

What is claimed is:

1. A system for heat sinking and environmental dissipation of heat generated by one or more ICs mounted to a printed circuit board (PCB) comprising:
   a primary thermally conductive plate;
   one or more thermally conductive first discs in intimate thermal contact with the primary plate and in intimate thermal contact with at least one of the ICs;
   a second thermally conductive plate mounted to the primary plate; and
   one or more thermally conductive second discs attached to the second plate, wherein the second discs attached to the second plate make intimate contact with one or more ICs mounted to the printed circuit board not contacted by any first discs attached to the primary plate.

2. The system of claim 1, wherein the printed circuit board is a line card and the primary and second plates are composed substantially of one of aluminum or copper.

3. The system of claim 1, wherein the one or more first and second discs are composed substantially of one of aluminum or copper.

4. The system of claim 1, wherein the one or more first and second discs are joined to the primary and second plates by rivets.

5. The system of claim 1, wherein the one or more first and second discs and the one or more ICs arc separated by a space filled with a thermal dielectric compound.

6. The system of claim 1, wherein the one or more first and second discs and the one or more ICs are in intimate contact.

7. The system of claim 1, wherein the primary plate is separated from the PCB in a parallel plane by a plurality of standoffs.

8. The system of claim 1, wherein the one or more ICs are mounted to both sides of the PCB and wherein the second plate is mounted to the PCB on a side opposite the primary plate.

9. A system for dissipation of heat generated by a plurality of ICs mounted to a plurality of printed circuit boards (PCBs) comprising:
   a plurality of thermally conductive primary plates mounted at least one each to individual ones of the printed circuit boards;
   a plurality of second plates mounted at least one each to each of the primary plates;
   a plurality of thermally conductive first discs in intimate thermal contact with individual ones of the primary plates, and also in intimate thermal contact with individual ones of the ICs;
   a plurality of thermally conducted second discs in intimate thermal contact with individual ones of the second plates, and also in intimate thermal contact with individual ones of the ICs not contacted by the first discs; and
   a source of air directed onto the plurality of plates;
   characterized in that the first and second discs draw heat from the ICs, and transfer the heat into the primary and secondary plates, which conduct the heat away from the printed circuit boards.

10. The system of claim 9 wherein the plurality of plates and discs are composed substantially of one or both of copper and aluminum.

11. The system of claim 9, wherein the plurality of printed circuit boards are line cards plugged into card slots arranged adjacently in a telecommunications channel bank.

12. The system of claim 11, wherein the source of air is a compressor compressing and directing cooling air into each of the card slots.

13. The system of claim 9, wherein the primary plates are separated from the PCBs in parallel planes by a plurality of standoffs.

14. A method for mounting a thermal heat-sink system to a line card, the system including first and second conductive plates, and first and second thermally conductive discs attached to the plates respectively, including steps for:
   (a) inserting at least two set screws into threaded standoffs provided on the line card for the first plate and at least two set screws into threaded standoffs provided on the line card for the second plate;
   (b) positioning the first plate with first discs facing the line card, over the alignment set screws and setting the system down on the standoffs so that the first discs achieve intimate contact with ICs attached to the line card, the alignment set screws extending through pattern matched openings in the system plate;
   (c) mounting the second plate onto the first plate with second discs facing the line card, the second discs making intimate contact with ICs attached to the line card not contacted by the first discs;
   (d) threading machine screws into the standoffs not containing an alignment screw, the machine screws inserted through pattern matched openings in the plate of the system;
   (e) tightening the machine screws to an acceptable torque;
   (f) removing the alignment set screws;
   (g) threading machine screws into the remaining standoffs through the remaining pattern matched openings in the plate of the system; and
   (h) tightening the machine screws to the acceptable torque.

15. The method of claim 14, further including a step between steps (a) and (b) for applying a thermal dielectric compound to each of the thermally conductive discs to bridge gaps between disc surfaces and ICs.

* * * * *